(12) United States Patent
Chaudhry et al.

(10) Patent No.: US 8,643,425 B2
(45) Date of Patent: Feb. 4, 2014

(54) LEVEL SHIFTER CIRCUIT

(75) Inventors: Nidhi Chaudhry, Ghaziabad (IN); Parul K. Sharma, Noida (IN); Amit K. Srivastava, Penang (MY)

(73) Assignee: Freescale Semiconductor, Inc., Austin, TX (US)

( * ) Notice: Subject to any disclaimer, the term of this patent is extended or adjusted under 35 U.S.C. 154(b) by 245 days.

(21) Appl. No.: 13/235,499

(22) Filed: Sep. 19, 2011

(65) Prior Publication Data

US 2013/0069707 A1    Mar. 21, 2013

(51) Int. Cl.
*H03L 5/00* (2006.01)

(52) U.S. Cl.
USPC ........................................ 327/333; 327/306

(58) Field of Classification Search
USPC ............. 327/306, 333; 326/62–64, 68, 80, 81
See application file for complete search history.

(56) References Cited

U.S. PATENT DOCUMENTS

| | | | |
|---|---|---|---|
| 6,535,019 B2 * | 3/2003 | De Santis | 326/83 |
| 7,009,424 B2 | 3/2006 | Khan | |
| 7,382,158 B2 | 6/2008 | Kimura | |
| 7,397,297 B2 | 7/2008 | Kimura | |
| 7,443,223 B2 | 10/2008 | Bajkowski | |
| 7,446,566 B1 | 11/2008 | Chrudimsky | |
| 7,501,876 B2 | 3/2009 | Kimura | |
| 7,683,668 B1 | 3/2010 | Thakur | |
| 7,956,662 B2 | 6/2011 | Arora | |
| 7,994,820 B2 | 8/2011 | Campbell | |

* cited by examiner

*Primary Examiner* — Lincoln Donovan
*Assistant Examiner* — Diana J Cheng
(74) *Attorney, Agent, or Firm* — Charles Bergere

(57) ABSTRACT

An embedded system includes a level shifter circuit for generating a forward supply voltage level in a predefined range. A sense circuit senses a core supply voltage level of the embedded system and compares the sensed core supply voltage level with a predetermined minimum core supply voltage level needed to generate the forward supply voltage. A reset circuit maintains one or more input nodes and one or more internal nodes of the level shifter circuit at a predetermined voltage level when the core supply voltage level is less than the predetermined minimum core supply voltage level.

10 Claims, 3 Drawing Sheets

LEVEL SHIFTER CIRCUIT

BACKGROUND OF INVENTION

The present invention relates to voltage level shifters for electronic devices and, more particularly, to a level shifter circuit that operates even if a supply voltage drops below a level necessary to generate a shifted signal.

With rapid advancements in the field of integrated circuits (ICs), specifications for ICs also have changed. Although an internal operating voltage of 5V was common in conventional ICs, an internal operating voltage for IC devices today is usually 3.3V or 1.8V. In a multi-voltage system, integration of more than one type of IC in a functional system is common. Hence, there is a requirement for a level shifter circuit for shifting the voltage level at the output of one IC to the voltage level at the input of another IC. The output of an IC that operates at a higher voltage level may be provided to another IC that operates at a lower voltage level. In this case, the voltage needs to be ramped down to a lower level. Similarly, when the output of an IC that operates at a lower voltage level is input to an IC that has a higher operating voltage, the voltage needs to be ramped up.

A limitation of a conventional level shifter is if the input levels are at intermediate levels, the shifter cannot provide correct output characteristics. This may cause excessive leakage current. Further, a conventional level shifter may fail to operate during a power ramp-up. For instance, core supply or analog supply may not be switched ON/OFF or be below/above a threshold level required for the level shifter to operate. Further, an external power ON is not guaranteed when supply voltages ramp down. In such cases, the conventional level shifter may attain undefined output states and may cause indefinite current flow in the circuit. Also, the level shifter may exceed reliability limits, resulting in output degradation.

In view of the foregoing, there is a need for a level shifter circuit that supports specific supply sequencing without leading to extra provisions on system boards. It is desirable that the level shifter supports power supply sequence independent designs and overcomes constraints associated with dependence on external power on a reset input. It is also desirable that the level shifter output is at a defined state during power ramp up/down, and that the level shifter has the ability to reduce the leakage current during supply ramp up/down.

BRIEF DESCRIPTION OF THE DRAWINGS

The following detailed description of the preferred embodiments of the present invention will be better understood when read in conjunction with the appended drawings. The present invention is illustrated by way of an example that includes, but is not limited to, accompanying figures in which like references indicate similar elements.

DETAILED DESCRIPTION OF THE INVENTION

The detailed description of the appended drawings is intended as a description of the preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for operating a level shifter circuit to maintain forward supply voltage levels in predefined ranges is provided. A core supply voltage level is sensed by a sense circuit and then compared with a predefined core supply voltage level. The predefined core supply voltage level is the voltage level necessary to ensure voltage level shifting at the output of the level shifter circuit. When the sensed core supply voltage level is less than the predefined core supply voltage level, one or more input nodes and internal nodes of the level shifter circuit are maintained at a predetermined voltage level that allows the level shifter circuit to maintain one or more forward supply voltage levels in one or more predefined ranges.

In another embodiment of the invention, an embedded system for maintaining forward supply voltage levels in predefined ranges is provided. The embedded system includes a level shifter circuit that generates one or more forward supply voltage levels in predefined ranges. The level shifter circuit includes one or more input nodes, one or more internal nodes, one or more output nodes, and a ground node. A sense circuit is provided that senses a core supply voltage level of the embedded system. The sense circuit also compares the sensed core supply voltage level with a predetermined core supply voltage level. The predetermined core supply voltage level is that voltage level necessary to ensure voltage level shifting at the output nodes of the level shifter circuit. A reset circuit maintains the input nodes and internal nodes of the level shifter circuit at predetermined voltage levels when the core supply voltage level is less than the predetermined core supply voltage level.

The method and the system described herein have a number of advantages. For instance, the embedded system facilitates defined output states for the level shifter circuit when the core supply voltage is turned OFF or is below a predetermined core supply voltage level. Further, the embedded system of the present invention is supply independent and will allow for continuous operation of a high-voltage I/O design using low-voltage transistors. Also, the embedded system provides the ability to mix gigabit design working of low voltage devices with existing 3.3V and 5V circuits on the same chip.

Figure 1:
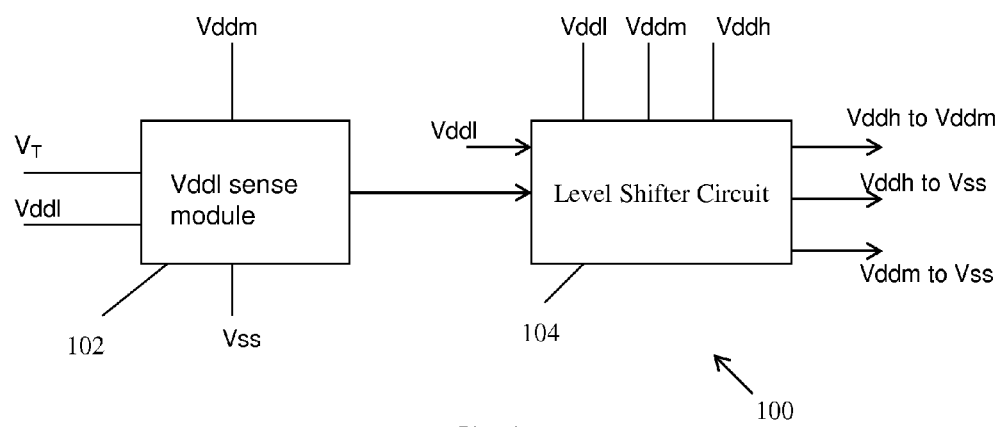
FIG. 1 is a schematic block diagram illustrating an embedded system including a sense and reset module and a level shifter circuit in accordance with an embodiment of the present invention.

FIG. 1 is block diagram illustrating an embedded system 100 that maintains forward supply voltage levels in one or more predefined ranges in accordance with an embodiment of the present invention. The embedded system 100 includes a sense and reset module 102 that has as inputs a core supply voltage $V_{ddL}$, a threshold voltage $V_T$, a supply signal $V_{ddm}$ and a ground node $V_{ss}$ and generates and output signal Vddl OFF DETECT. The embedded system 100 further includes a level shifter circuit 104 connected to the sense and reset module 102 that receives the Vddl OFF DETECT signal and generates outputs in one or more predefined ranges, namely Vddh to Vddm, Vddh to Vss, and Vddm to Vss.

More particularly, the sense and reset module 102 compares the value of the input core supply voltage $V_{ddl}$ with the value of the threshold voltage $V_T$ and generates the Vddl OFF DETECT signal when the value of core supply voltage level $V_{ddl}$ is less than the threshold voltage $V_T$. The sense and reset module 102 further maintains one or more input nodes and one or more internal nodes of the level shifter circuit 104 at a predefined voltage level. Maintaining the one or more input nodes and the one or more internal nodes of the level shifter circuit 104 at the predefined voltage level ensures proper functioning of the level shifter circuit 104.

The level shifter circuit 104 receives the Vddl OFF DETECT signal from the sense and reset module 102 as well as supply signals $V_{ddl}$, $V_{ddm}$, and $V_{ddh}$ and generates outputs in one or more predefined voltage ranges, as mentioned above.

Figure 2A:
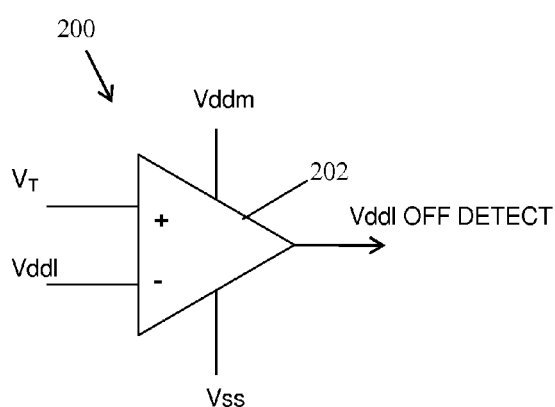
FIG. 2A is a schematic circuit diagram illustrating a sense circuit of the sense and reset module of FIG. 1 in accordance with an embodiment of the present invention.

FIG. 2A illustrates a circuit diagram of a sense circuit 200 of the sense and reset module 102. In one embodiment, the sense circuit 200 includes a comparator 202 for comparing the values of the input core supply voltage $V_{ddl}$ and the threshold voltage $V_T$. The comparator 200 also is connected to the supply signal $V_{ddm}$ and the ground node $V_{ss}$. The supply signal $V_{ddm}$ is chosen with reference to required predefined output voltage ranges. The comparator 200 generates the output Vddl OFF DETECT signal when the value of the input core supply voltage $V_{ddl}$ is less than the threshold voltage $V_T$.

Figure 2B:
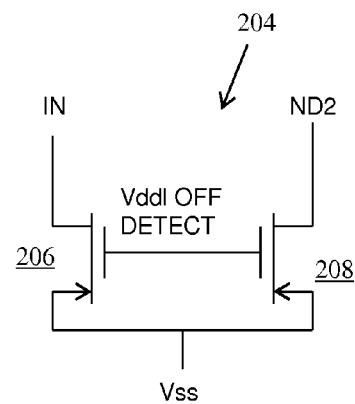
FIG. 2B is a schematic circuit diagram illustrating a reset circuit of the sense and reset module of FIG. 1 in accordance with an embodiment of the present invention.

FIG. 2B illustrates a circuit diagram of a reset circuit 204 of the sense and reset module 102 in accordance with an embodiment of the present invention. The reset circuit 204 includes first and second voltage limiting devices 206 and 208. In various embodiments of the invention, each of the voltage limiting devices 206 and 208 corresponds to one of NMOSFET, PMOSFET and CMOSFET. The reset circuit 204 is connected to the sense circuit 200 such that the output of the sense circuit 200 is an input of the reset circuit 204. More particularly, the output of the sense circuit 200 is provided at the gates of the first and second voltage limiting devices 206 and 208. Based on the output of the sense circuit 200, the first and second voltage limiting devices 206 and 208 are turned ON to maintain one or more input and internal nodes of the level shifter circuit 104 at a predetermined voltage level. In an embodiment of the present invention, the first and second voltage limiting devices 206 and 208 are turned ON when the input $V_{ddl}$ OFF DETECT signal is received, in which case the first and second voltage limiting devices 206 and 208 maintain one or more nodes of the level shifter circuit 104 at an ON state.

Figure 3:
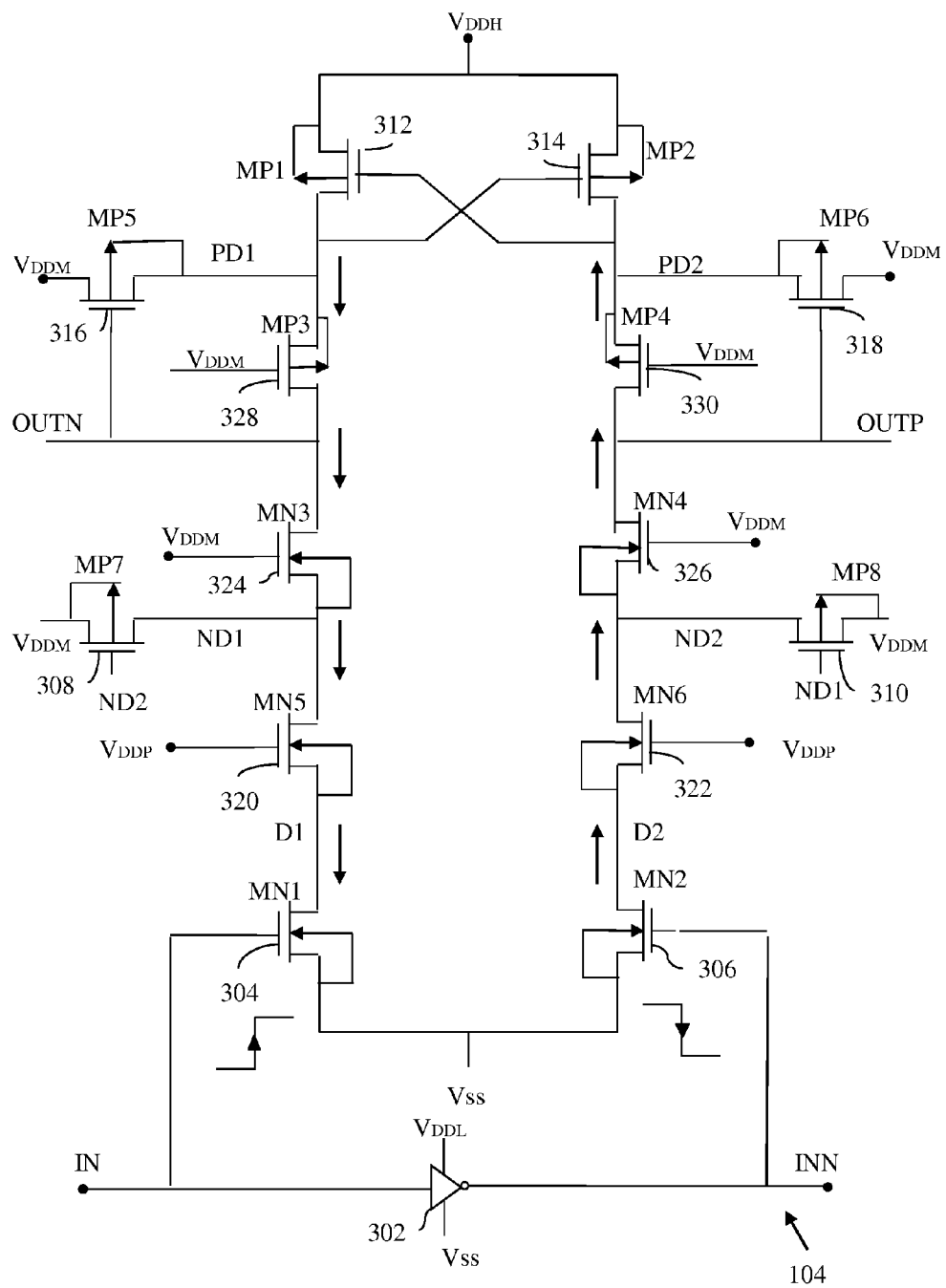
FIG. 3 is a schematic circuit diagram of the level shifter circuit of FIG. 1 in accordance with an embodiment of the present invention.

FIG. 3 illustrates a detailed circuit diagram of a level shifter circuit 104 in accordance with an embodiment of the present invention. The level shifter circuit 104 includes an inverter 302 and a plurality of latches (Latch 1 and Latch 2). Latch 1 includes a first plurality of transistors 304, 306, 308, and 310; and Latch 2 includes a second plurality of transistors 312, 314, 316, and 318. The inverter 302 includes an input terminal IN and an output terminal INN respectively connected to the inputs of the transistors 304 and 306. In an embodiment of the present invention, the inverter 302 is a NOT gate.

Transistors 304 and 306 of Latch 1 comprise a first pair of input transistors and the transistors 308 and 310 comprise a first pair of output transistors. Similarly, for Latch 2, transistors 316 and 318 comprise a second pair of input transistors and transistors 312 and 314 comprises a second pair of output transistors. In an embodiment of the present invention, the first pair of input transistor 304 and 306 is connected as a differential amplifier.

The level shifter circuit 104 further includes a plurality of input nodes IN, INN a plurality of output nodes OUTP, OUTN, ND1, ND2, PD1 and PD2; supply signals $V_{DDP}$, $V_{DDM}$, and $V_{DDH}$; and a common ground node $V_{ss}$. A first pair of protection transistors 320 and 322 is provided to protect the first pair of input transistor 304 and 306. Each of the protection transistors 320 and 322 has its gates biased at an internally derived bias voltage that is close to the input core supply voltage $V_{ddl}$ for device protection. In accordance with the present embodiment, the gate bias voltage should not exceed the reliability limit of a core device of the level shifter circuit 104. Further, the source terminal of each transistor of the first pair of protection transistors 320 and 322 is connected to the drain of input devices 304 and 306.

The level shifter circuit 104 further includes a plurality of circuit transistors 324, 326, 328, and 330 connected to each other as shown in FIG. 3. In an embodiment of the invention, each of the circuit transistors 324, 326, 328, and 330 is a voltage limiting device. In another embodiment of the present invention, the first pair of input transistors 304 and 306, the protection transistors 320 and 322 and circuit transistors 324 and 326 are NMOS devices, and the second pair of input transistors 316 and 318, the first pair of output transistors 308 and 310, the second pair of output transistors 312 and 314, and circuit transistors 328 and 330 are PMOS devices. However, in other embodiments of the invention, the transistors 204-330 may comprise various combinations of PMOS FETS, NMOS FETS, CMOS FETS, and BJTS (bipolar junction transistors).

The transistors 304-330 are connected, as shown, to operate as a voltage level shifter. However, the present invention also applies to current mode logic receivers, such as High-Definition Multimedia Interface, such that the signal swing is 500 mV relative to $V_{ddh}$. Further, a CMOS circuit can be created using PMOS devices as inputs working on $V_{ddh}$ and the rest of the network converted to result in outputs with respect to $V_{ddh}$.

Figure 4:
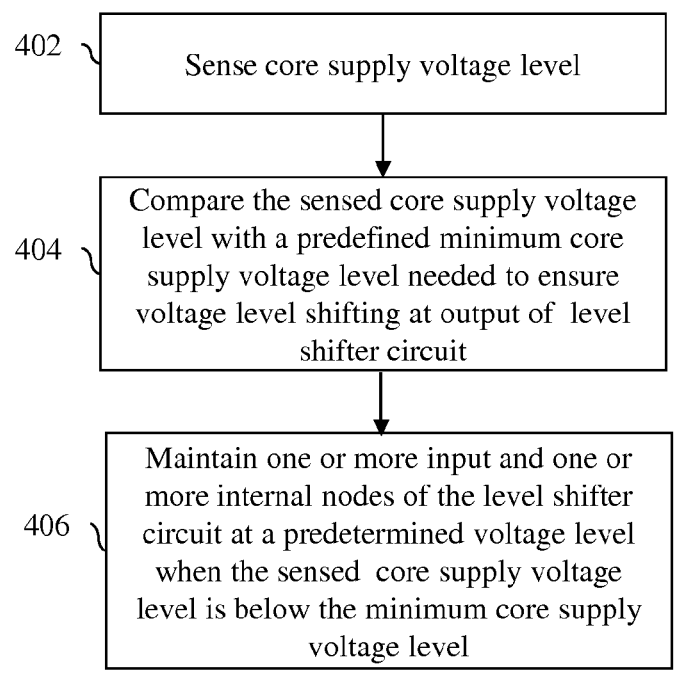
FIG. 4 is a flow chart illustrating a method of operating a level shifter circuit to maintain forward supply voltage levels in predefined ranges in accordance with an embodiment of the present invention.

FIG. 4 is a flow chart of a method for operating a level shifter circuit to maintain forward supply voltage levels in predefined ranges. Although the method illustrated in FIG. 4 is explained with reference to the system of FIGS. 1, 2, and 3, it will understood by a person skilled in art that the method may be performed by different embodiments that are intended to be encompassed within the spirit and scope of the present invention.

At step 402, a core supply voltage level is sensed. In the embodiment of the present invention illustrated in FIG. 2, the core supply voltage level is sensed by the sense circuit 200. At step 404, the sensed core voltage supply voltage level is compared with a predefined core supply voltage level, which is the voltage level required to ensure voltage level shifting at the output of the embedded system 100.

At step 406, one or more internal nodes or one or more input nodes of the level shifter circuit 104 of the embedded device 100 are maintained at predetermined voltage levels if the sensed core supply voltage level is determined to be below the predefined core supply voltage level. This allows the level shifter circuit 104 to maintain one or more forward supply voltage levels in one or more predefined ranges. In the embodiment illustrated in FIGS. 1, 2, and 3, the level shifter circuit 104 generates outputs at three different voltage ranges, including $V_{ddh}$ to $V_{ddm}$, $V_{ddh}$ to $V_{ss}$ and $V_{ddm}$ to $V_{ss}$.

The method and system described above have a number of advantages. The embedded system facilitates defined output states for the level shifter circuit when the core supply voltage is turned OFF or is below a predetermined minimum core supply voltage level. Further, the embedded system of the present invention is supply independent and continues to operate high voltage I/O design using lower voltage I/O transistors. Furthermore, the embedded device design provides the ability to mix low voltage gigabit circuits formed with low voltage devices with existing 3.3V and 5V circuits on the same chip.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method for operating a level shifter circuit to maintain forward supply voltage levels in predefined ranges, the method comprising:
    sensing a core supply voltage level;
    comparing the sensed core supply voltage level with a predefined core supply voltage level needed to ensure voltage level shifting at an output of the level shifter circuit;
    maintaining one or more input nodes and one or more internal nodes of the level shifter circuit at a predetermined voltage level when the sensed core supply voltage level is below the predefined core supply voltage level;
    operating the level shifter circuit using a transistor pair connected as a differential amplifier; and
    protecting the transistor pair with a pair of protection transistors, wherein the protection transistors receive an input from at least one of the one or more input nodes, and wherein gates of the protection transistor pair are biased within a predefined voltage difference from the core supply voltage level.

2. The method of claim 1, wherein maintaining the one or more input nodes and one or more internal nodes of the level shifter circuit at the predetermined voltage level comprises maintaining the one or more input nodes at a predetermined low voltage level.

3. An embedded system for maintaining forward supply voltage levels in predefined ranges, the embedded system comprising:
    a level shifter circuit that generates one or more forward supply voltage levels in predefined ranges, the level shifter circuit comprising one or more input nodes, one or more internal nodes, one or more output nodes, and a common ground node;
    a sense circuit for sensing a core supply voltage level of the embedded system and comparing the sensed core supply voltage level with a predetermined core supply voltage level that is needed to ensure voltage level shifting at the output nodes of the level shifter circuit;
    a reset circuit that maintains the one or more input nodes and one or more internal nodes of the level shifter circuit at a predetermined voltage level when the core supply voltage level is less than the predetermined core supply voltage level; and
    a protection transistor pair that receive an input from at least one of the one or more input nodes, and wherein gates of the protection transistor pair are biased within a predefined voltage difference from the core supply voltage level.

4. The embedded system of claim 3, wherein the reset circuit comprises a pair of first voltage limiting devices that receive an input signal from the sense circuit, and wherein each of the pair of first voltage limiting devices is connected to the common ground node.

5. The embedded system of claim 4, wherein the first voltage limiting devices comprise one of a PMOS field effect transistor, an NMOS field effect transistor, a CMOS transistor, and a bipolar junction transistor.

6. The embedded system of claim 4, wherein the level shifter circuit further comprises a plurality of second voltage limiting devices, wherein the plurality of second voltage limiting devices protect the internal nodes from exceeding a predefined reliability limit.

7. The embedded system of claim 6, wherein each of the plurality of second voltage limiting devices is one of a PMOS field effect transistor, an NMOS field effect transistor, a CMOS transistor and a bipolar junction transistor.

8. The embedded system of claim 3, wherein the level shifter circuit further comprises a transistor pair connected as a differential amplifier.

9. The embedded system of claim 8, wherein the level shifter circuit further comprises an inverter having an input node and an output node connected to each of the transistors of the transistor pair.

10. The embedded system of claim 3, wherein the sense circuit comprises a comparator for comparing the core supply voltage level with the predetermined minimum core supply voltage level.

* * * * *